(12) United States Patent
Komatsu et al.

(10) Patent No.: US 8,421,153 B2
(45) Date of Patent: Apr. 16, 2013

(54) SEMICONDUCTOR DEVICE

(75) Inventors: Kanako Komatsu, Yokohama (JP); Jun Morioka, Yokohama (JP); Koji Shirai, Yokohama (JP); Keita Takahashi, Yokohama (JP); Tsubasa Yamada, Yokohama (JP); Mariko Shimizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 26 days.

(21) Appl. No.: 13/241,107

(22) Filed: Sep. 22, 2011

(65) Prior Publication Data
US 2012/0241858 A1     Sep. 27, 2012

(30) Foreign Application Priority Data
Mar. 23, 2011 (JP) .................... P2011-63875

(51) Int. Cl.
*H01L 29/66* (2006.01)
*H01L 27/088* (2006.01)

(52) U.S. Cl.
USPC ................. 257/339; 257/401; 257/335

(58) Field of Classification Search ............ 257/339, 257/401
See application file for complete search history.

(56) References Cited

U.S. PATENT DOCUMENTS

| | | | | |
|---|---|---|---|---|
| 5,087,954 A * | 2/1992 | Shirai | ............ | 257/409 |
| 5,191,401 A * | 3/1993 | Shirai et al. | ............ | 257/328 |
| 5,306,938 A * | 4/1994 | Shirai | ............ | 257/344 |
| 5,523,599 A | 6/1996 | Fujishima et al. | | |
| 5,910,670 A | 6/1999 | Ludikhuize | | |
| 6,441,432 B1 | 8/2002 | Sumida | | |
| 6,559,504 B2 * | 5/2003 | Nishibe et al. | ............ | 257/343 |
| 7,400,016 B2 * | 7/2008 | Inaba | ............ | 257/337 |
| 8,212,312 B2 * | 7/2012 | Sasaki | ............ | 257/329 |
| 2012/0168819 A1 * | 7/2012 | Marino et al. | ............ | 257/192 |

FOREIGN PATENT DOCUMENTS

JP     2000-505956     5/2000

* cited by examiner

*Primary Examiner* — Julio J Maldonado
*Assistant Examiner* — Charles N Ausar-El
(74) *Attorney, Agent, or Firm* — Patterson & Sheridan, LLP

(57) ABSTRACT

A first semiconductor layer extends from the element region to the element-termination region, and functions as a drain of the MOS transistor. A second semiconductor layer extends, below the first semiconductor layer, from the element region to the element-termination region. A third semiconductor layer extends from the element region to the element-termination region, and is in contact with the second semiconductor layer to function as a drift layer of the MOS transistor. A distance between a boundary between the first semiconductor layer and the field oxide film, and the end portion of the third semiconductor layer on the fifth semiconductor layer side in the element region is smaller than that between a boundary between the first semiconductor layer and the field oxide layer and an end portion of the third semiconductor layer on the fifth semiconductor layer side in the element-termination region.

20 Claims, 5 Drawing Sheets

SEMICONDUCTOR DEVICE

CROSS REFERENCE TO RELATED APPLICATIONS

This application is based on and claims the benefit of priority from prior Japanese Patent Application No. 2011-63875, filed on Mar. 23, 2011, the entire contents of which are incorporated herein by reference.

FIELD

Embodiments described herein relate to a semiconductor device.

BACKGROUND

A DMOS transistor is known as one of power semiconductor devices.

The DMOS transistor comprises a drift region adjacent to a drain diffusion layer having a high impurity concentration. The drift region has the same conductivity type as that of the drain diffusion layer, and has a lower impurity concentration than the drain diffusion layer. The DMOS transistor is characterized in that its switching speed is fast in a relatively-low voltage region, and its conversion efficiency is high. The DMOS transistor may perform an operation with a high breakdown voltage and a low ON resistance may be achieved at the same time. However, in such a DMOS transistor, an element termination region is formed at an end region of an element region where a DMOS transistor itself is formed. In some cases, an element termination region does not have a predetermined breakdown voltage even when an element region has such a predetermined breakdown voltage.

In this case, the breakdown voltage of the whole element is determined by the breakdown voltage of the element termination region. With the conventional DMOS transistor, concentration of an electric field occurs in such an element termination region, and impact-ion due to this may easily be generated. As a result, a breakdown voltage of the whole semiconductor device becomes lower. Therefore, a semiconductor device having an element termination region with a high breakdown voltage is required. On the other hand, it is highly requested that a circuit area of the whole semiconductor device is decreased.

DETAILED DESCRIPTION

Figure 1:
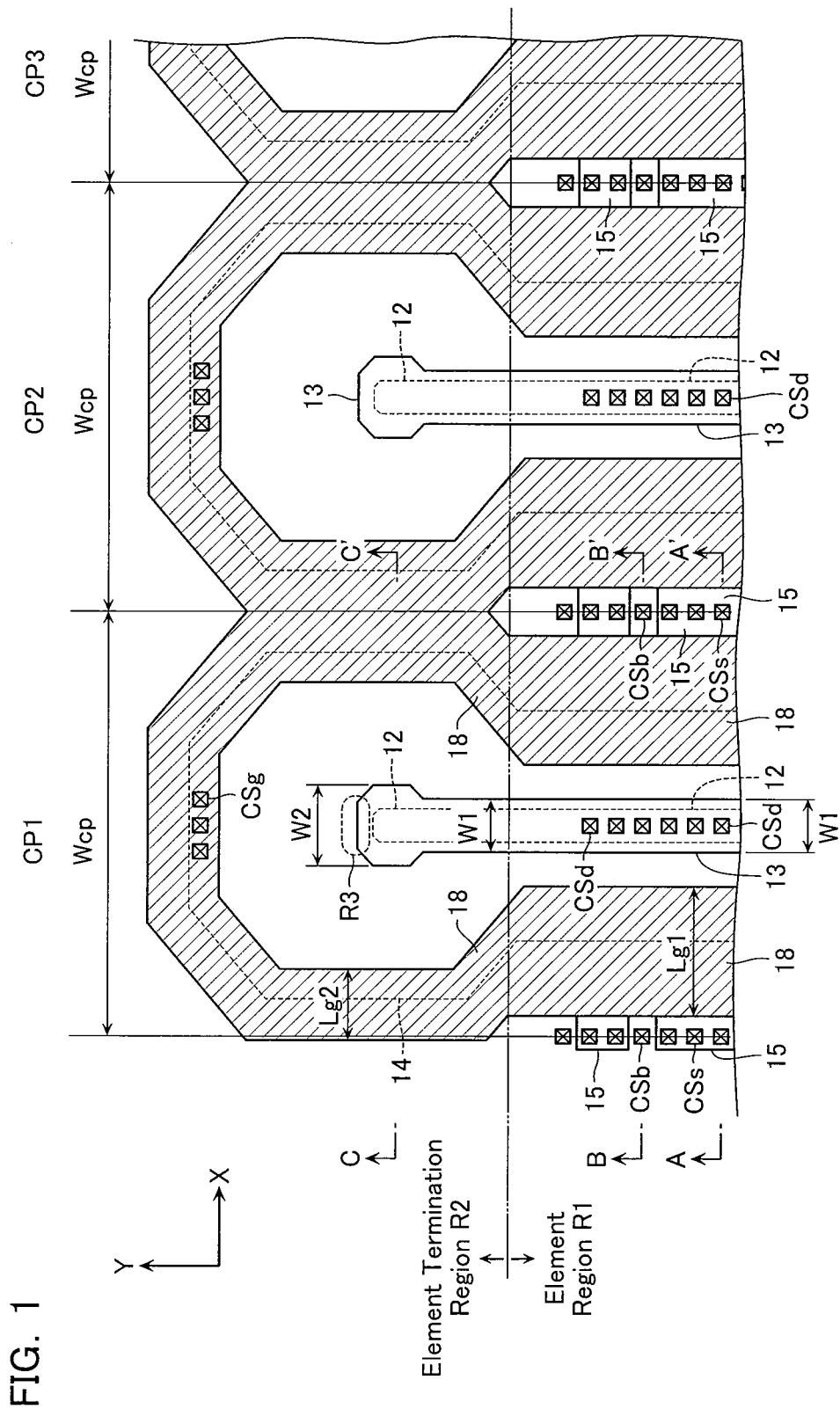
FIG. 1 is a plan view showing a structure of the semiconductor device according to the embodiment.

A semiconductor device according to embodiments described hereinbelow includes an element region formed on a semiconductor substrate and including an MOS transistor formed thereon, and an element termination region formed on the semiconductor substrate and formed at an end region of the element region. A first semiconductor layer of a first conductivity type is formed to extend in a first direction as its lengthwise direction from the element region to the element termination region. The first semiconductor layer has a first impurity concentration, and functions as a drain region of the MOS transistor in the element region. A second semiconductor layer of a first conductivity type is formed to extend in a first direction as its lengthwise direction from the element region to the element termination region. The second semiconductor layer is formed in a layer below the first semiconductor layer, and has a second impurity concentration that is smaller than the first impurity concentration. A third semiconductor layer of the first conductivity type is formed to extend in a first direction as its lengthwise direction from the element region to the element termination region. The third semiconductor layer has a third impurity concentration that is smaller than the second impurity concentration. The third semiconductor layer is arranged in contact with the second semiconductor layer and functions as a drift layer of the MOS transistor. A field oxide film is formed on a surface of the third semiconductor layer and in contact with the first semiconductor layer. A fourth semiconductor layer of the second conductivity type is formed on the semiconductor layer to extend in a first direction as its lengthwise direction from the element region to the element termination region. The fourth semiconductor layer functions as a channel region of the MOS transistor in the element region. A fifth semiconductor layer of the first conductivity type is formed on a surface of the fourth semiconductor layer and functions as a source region of the MOS transistor. A gate electrode is formed on a surface of the semiconductor substrate between the third semiconductor layer and the fourth semiconductor layer, via a gate insulating film. A distance between a boundary between the first semiconductor layer and the field oxide film, and the end portion of the third semiconductor layer on the side of the fifth semiconductor layer in the element region is smaller than a distance between a boundary between the first semiconductor layer and the field oxide layer and an end portion of the third semiconductor layer on the side of the fifth semiconductor layer in the element termination region.

The semiconductor device according to the embodiment is described hereinbelow with reference to the drawings. Referring now to FIGS. 1-4, a laminated structure of the semiconductor device according to the embodiment is described. This semiconductor device relates to a p-channel type DMOS transistor. It is possible that conductivity types of all of the semiconductor layers in FIGS. 1-4 are reversed, thereby forming a an n-channel type DMOS transistor formed on a P⁻ type substrate or p⁻ type semiconductor layer.

Figure 2:
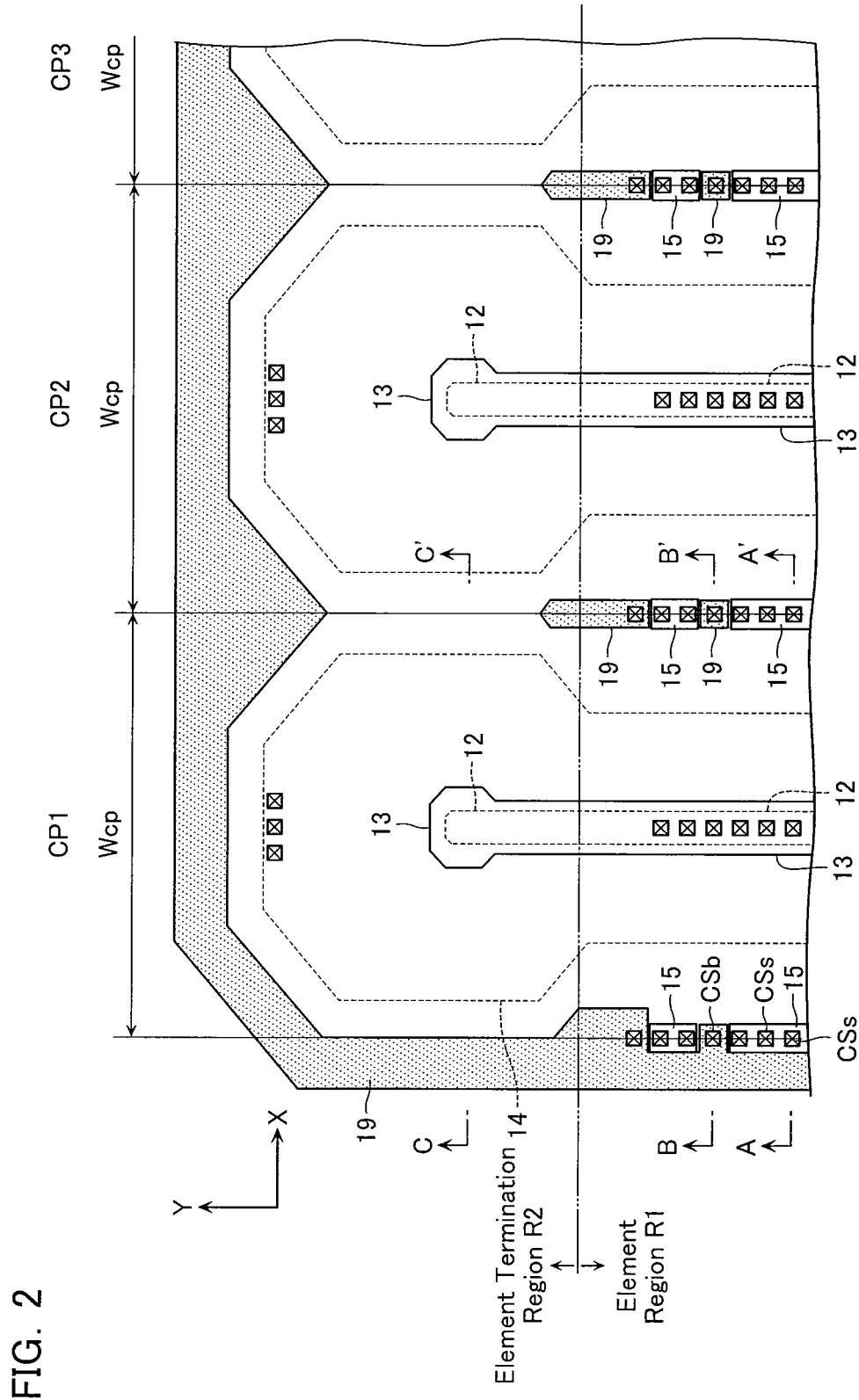
FIG. 2 is a plan view showing a structure of the semiconductor device according to the embodiment.
Figure 3:
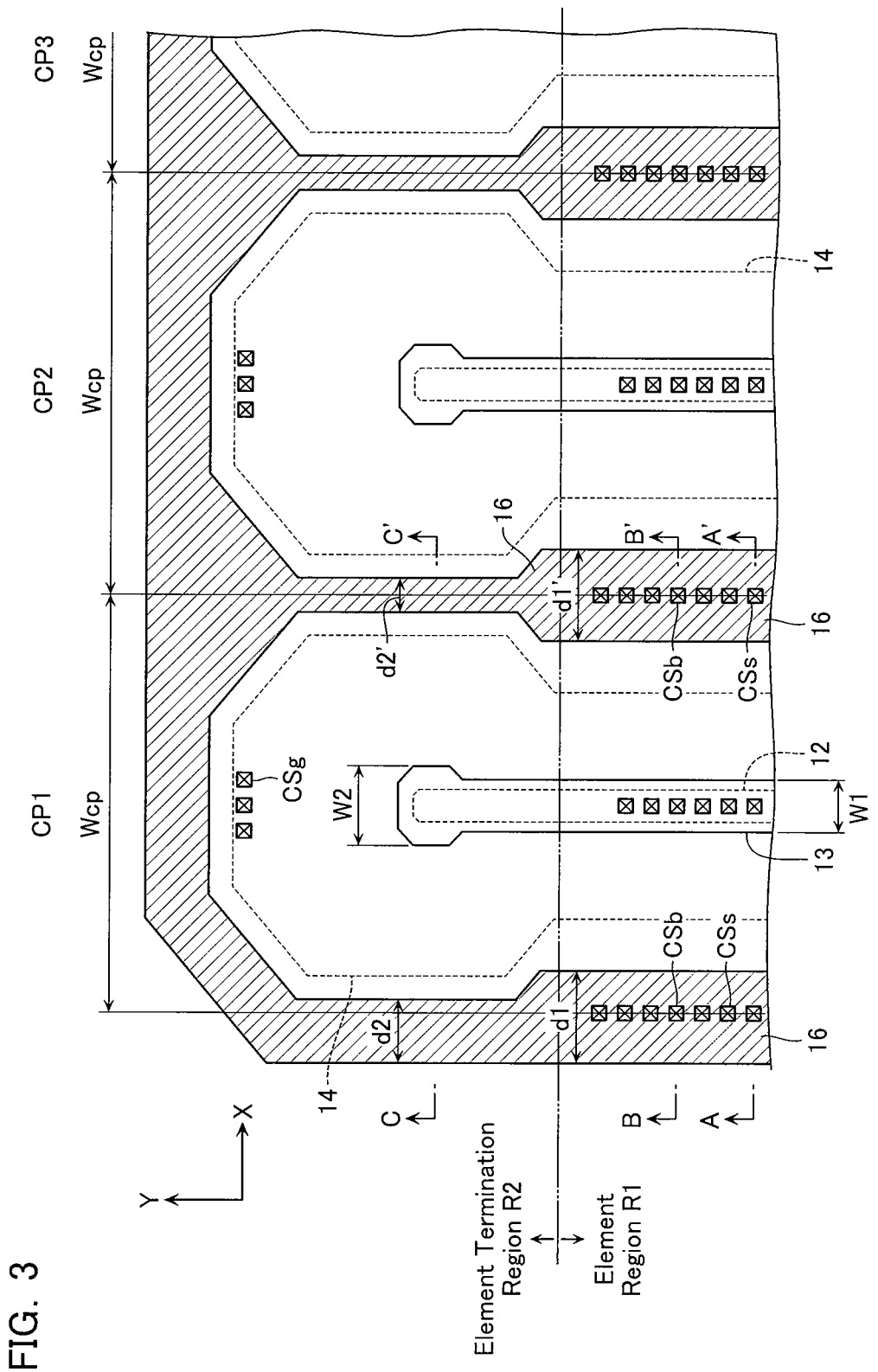
FIG. 3 is a plan view showing a structure of the semiconductor device according to the embodiment.
Figure 4:
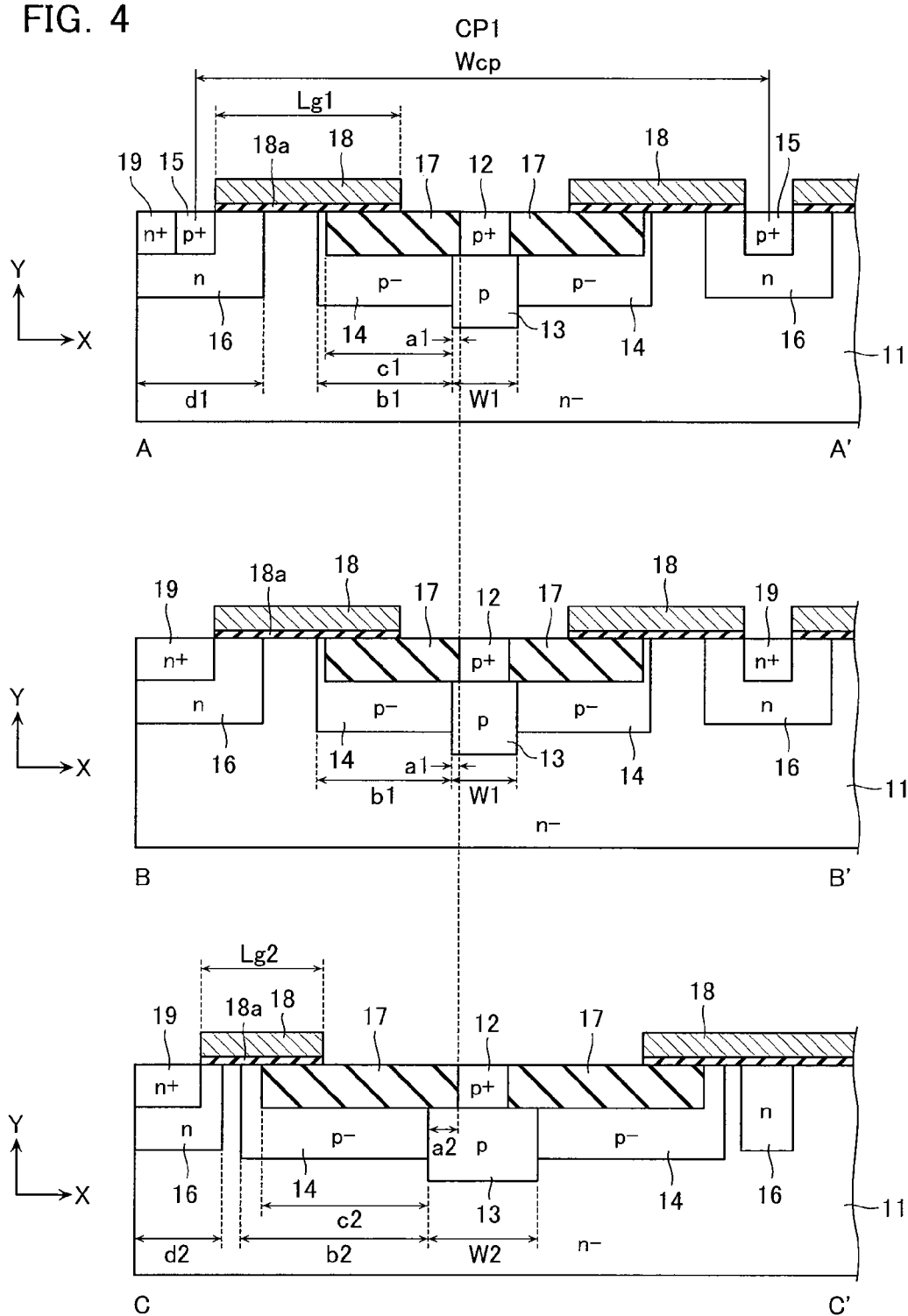
FIG. 4 is A-A' B-B' and C-C' sectional views of FIG. 1-FIG. 3.

FIG. 1 to FIG. 3 illustrate plan views of the semiconductor device according to the embodiment. FIG. 1 to FIG. 3 each illustrates some of the components in a selective manner to show positional relationship among overlapping components. Also, FIG. 4 shows A-A', B-B', and C-C sectional views of FIG. 1, FIG. 2, and FIG. 3. Note that in the following discussion "p⁻ type" designates a semiconductor whose impurity concentration is smaller than "P type".

Also, "n⁻ type" designates a semiconductor whose impurity concentration is smaller than "N type".

As shown in FIG. 1, the semiconductor device of the present embodiment is formed, for example, on an N type semiconductor substrate 11. The semiconductor substrate 11 includes an element region R1 and an element termination region R2. The element region R1 is a region for forming a p channel type DMOS transistor. The element termination region R2 is formed at the end region of the element region R1 in a first direction. Note that the semiconductor substrate 11 may be replaced by a p– type substrate.

As shown in FIG. 1, in the semiconductor device according to the embodiment, the element region R1 and element termination region R2 are divided into a plurality of rectangular areas CP. The rectangular areas CP1, CP2, CP3 . . . are arranged to be aligned along the X-direction. In addition, each of the rectangular areas CP1, CP2, CP3 . . . has the same width Wcp in the X-direction.

The width of each of the rectangular areas CP in the element region R1 and the width of each rectangular area CP in the element termination region R2 are both Wcp.
The semiconductor device of the present embodiment relates to an improvement in the shape of various components in such a rectangular area CP. This improvement can suppress increase in circuit area. Also, a semiconductor device with a high breakdown voltage can be provided.

Also, as shown in FIG. 1, a gate electrode 18 is formed on the semiconductor substrate 11 through a gate insulating film 18a (not illustrated in FIG. 1). As an example, the gate electrode 18 is extended not only in the element region R1 but also up to the element termination region R2. The gate electrode 18 is connected to a contact CSg in this element termination region R2, and is supplied with a necessary voltage. The gate electrode has a gate electrode length Lg1 in the element region R1, and has a gate electrode length Lg2 ($\neq$ Lg1) in the element termination region R2. The gate electrode 18 is located such that it is sandwiched by a P+ type drain region 12 functioning as a drain of the p-channel type DMOS transistor and a P+ type source region 15 functioning as a source of the p-channel type DMOS transistor, along the gate length direction. There is formed a P type diffusion region 13 in a layer below the drain region 12.

Also, an N type diffusion region 16 is formed in a layer below the source region 15 and a back gate diffusion region 19, as shown in FIG. 3.

FIG. 4 shows A-A', B-B', and C-C' sectional views of FIG. 1.

The A-A' section is a section along the drain region 12 and the source region 15 of the above-mentioned p channel type MOS transistor. The B-B' section is a section along the drain region 12 and the back gate diffusion region 19 of the p channel MOS transistor. The C-C' section is a section of the element termination region R2 including the vicinity of the end portion of the drain region 12.

First, the structure of the p channel type MOS transistor along the A-A' section is described with reference to FIG. 4. As shown in the A-A' section of FIG. 4, the p channel type MOS transistor includes the P+ type drain region 12. As shown in FIGS. 1-3, the P+ type drain region 12 is formed to have a rectangular shape with the Y-direction (the first direction) as its lengthwise direction. The drain region 12 is arranged in the vicinity of the center of the rectangular area CP along the X-direction. The drain region 12 extends from the element region R1 to the element termination region R2. The P+ type drain region 12 is injected with P type impurities such as boron (B), and has an impurity concentration of $1e20[cm^{-3}]$, for example.

The P type diffusion region 13 is formed in a layer below the drain region 12. The P type diffusion region 13 forms a a part of a drain of the p-channel type MOS transistor. The P-type diffusion region 13 is formed to extend from the element region R1 to the element termination region R2 in a Y-direction as its lengthwise direction.

The P type diffusion region 13 has an impurity concentration of about $1e18[cm^{-3}]$ that is smaller than an impurity concentration of the drain region 12.
The P type diffusion region 13 has a width W1 in the element region R1 (see A-A' sectional view of FIG. 4), whereas it has a width W2 in an area in the vicinity of the end portion of the drain region 12 in the element termination region R2 (see the C-C' section of FIG. 4). In addition, a distance a1 from the end of the drain region 12 to the end of the P type diffusion region 13 in the A-A' section is made smaller than a distance a2 from the end of drain region 12 to the end of the P type diffusion region 13 in the C-C' section. As an example, the distance a1 is around 0.1 μm, and the distance a2 is around 0.3 μm.

The p− type drift region 14 is formed at a position beneath the gate electrode 18 such that it contacts the P type diffusion region 13.
The p− type drift region 14 has an impurity concentration lower than an impurity concentration of the P type diffusion region 13, e.g., an impurity concentration of about $1e17[cm^{-3}]$. The drift region is formed to extend in the Y-direction as its lengthwise direction up to the element termination region R2, like the drain region 12. However, a width b1 of the drift region 14 from the junction of the P type diffusion region 13 in the A-A' section is made smaller than a width b2 thereof in the C-C' section. In addition, Also, a distance (a1+b1) from an end portion of the drift region 14 on the source region 15 side to an end portion of the drain region 12 (a border between the field oxide film 17 and the drain region 12) in the A-A' section is smaller than a distance (a2+b2) from an end portion of the drift region 14 on the source region 15 side to an end portion of the drain region 12 (a border between the field oxide film 17 and the drain region 12) in the C-C' section. Accordingly, when a reverse bias is applied to the p channel MOS transistor, a depletion layer easily spreads in the element termination region R2.

A field oxide film 17 composed of a silicon oxide film (e.g., SiO2 film) is formed on a surface of the P− type drift region 14. The field oxide film 17 extends in the Y-direction as its lengthwise direction, and the width c1 thereof in the A-A' section is made smaller than the width c2 thereof in the C-C' section. Note that the field oxide film 17 may be omitted, depending on a required breakdown voltage of the MOS transistor.

Also, an N type diffusion region 16 is formed at a position isolated from the drift region 14 on the semiconductor substrate 11. The N type diffusion region 16 and the semiconductor substrate 11 between the N type diffusion region 16 and the drift region 14 function as a channel region of this p channel type MOS transistor. The above-mentioned source region 15 is formed on the surface of this N type diffusion region 16. The source region 15 is connected to a source electrode which is not illustrated through a contact plug CSs.

The N type diffusion region 16 is formed to extend in the Y-direction as its lengthwise direction, like the gate electrode 18 and the like (see FIG. 3). The widths d1, d1' of this N type diffusion region 16 in the element region R1 are made smaller than the width d2, d2' thereof in the element termination region R2.

Like the gate electrode 18, the source region 15 is formed to extend in the Y-direction as its lengthwise direction. The source region 15 is located at the end portion in the X-direction of the rectangular area CP. Note that the source region 15 is divided at certain positions in the Y-direction, and the back gate diffusion region 19 is formed in the divided position (B-B' section), as shown in FIG. 2. The gate electrode 18 is formed on the semiconductor substrate 11 through the gate insulating film 18a to extend over the drift region 14, the N type diffusion region 16, and the source region 15.

Sizes, impurity concentrations and the like of the drain region 12, the P type diffusion region 13, the drift region 14, and the source region 15 may be set such that required characteristics such as an ON resistance, a breakdown voltage of the p channel MOS transistor in the element region are satisfied.

The shape of the p channel type MOS transistor in the B-B' section is approximately similar to that in the A-A' section. However, it is different from that in the A-A' section in that the source region 15 does not exist in the B-B' section, and, instead, the P+ type back gate diffusion region 19 is formed with a larger width.

As described above, the drain region 12, P type diffusion region 13, the drift region 14 and the N type diffusion region 16 are formed to extend in the Y-direction from the element region R1 to the element termination region R2 (see the C-C' section of FIG. 4). However, the width W2 of the P type diffusion region 13 along the C-C' section is made larger than the width W1 thereof in the element region R1 including the A-A' section. Thus, as shown in a plan view of FIG. 1, the P type diffusion region 13 has an expanded tip portion with a polygon shape, like a matchstick shape. Having such a shape, this embodiment may relax concentration of an electric field around the region R3 shown in FIG. 1, and suppress the generation of impact ions, thereby raising a breakdown voltage of the MOS transistor. In addition, in the element termination region R2, the width b2 of the drift region 14 along the C-C' section is made larger than the width b1 thereof in the element region R1 including the A-A' section. Due to this, in the element termination region R2, a depletion layer tends to spread more easily than in the element region R1, thereby improving a breakdown voltage in the element termination region R2.

On the other hand, the width d2 of the N type diffusion region 16 along the C-C' section is made smaller than the width d1 thereof in the element region R1 including the A-A' section. Decreasing the width of the N type diffusion region 16 in the element termination region R2 does not lower the breakdown voltage of the MOS transistor.

In this way, in the semiconductor device according to the present embodiment, while the width W2 of the P type diffusion region 13 in the C-C' section (in the element termination region R2) and the width b2 of the drift region 14 in the C-C' section are made larger than those in the element region R1. On the other hand, the width d2 of the N type diffusion region 16 is made smaller. An element width in the element termination region R2 can be the same as that in the element region R1. Accordingly, various components can be accommodated in the rectangular region CP, as a whole.

The above-mentioned widths W2, b2, and d2 may be determined irrespective of the widths W1, b1, d1 in the element region R1, and based on a breakdown voltage required in the element termination region 16. Even when the widths W2 and b2 are determined to have larger values than those of the widths W1 and b1, respectively, the width d2 may be determined to be smaller than the width d1. Accordingly, the width of the element termination region R2 along the X-direction need not be larger than the width of the element region R1 along the X-direction.

In this way, according to the present embodiment, while the element region R1 may be designed to obtain a P channel MOS transistor therein with an optimized ON resistance or the like, the element termination region R2 may be designed to obtain a required breakdown voltage.

In above-mentioned embodiment, an example has been explained in which the width b2 is made larger than the width b1, and the width W2 is made larger than the width W1. However, it is possible that only the width b2 is made larger than the width b1, and the width W2 is made substantially equal to the width W1. This also allows the breakdown voltage of the element termination region R2 to be raised.

However, enlarging the width W2 may contribute for preventing electric field concentration in the end portion of the P type diffusion region 13, thereby raising the breakdown voltage of the element. Accordingly, in addition to enlargement of the width b2, enlargement of the width W2 may serve to raise the breakdown voltage of the element termination region even more.

Figure 5:
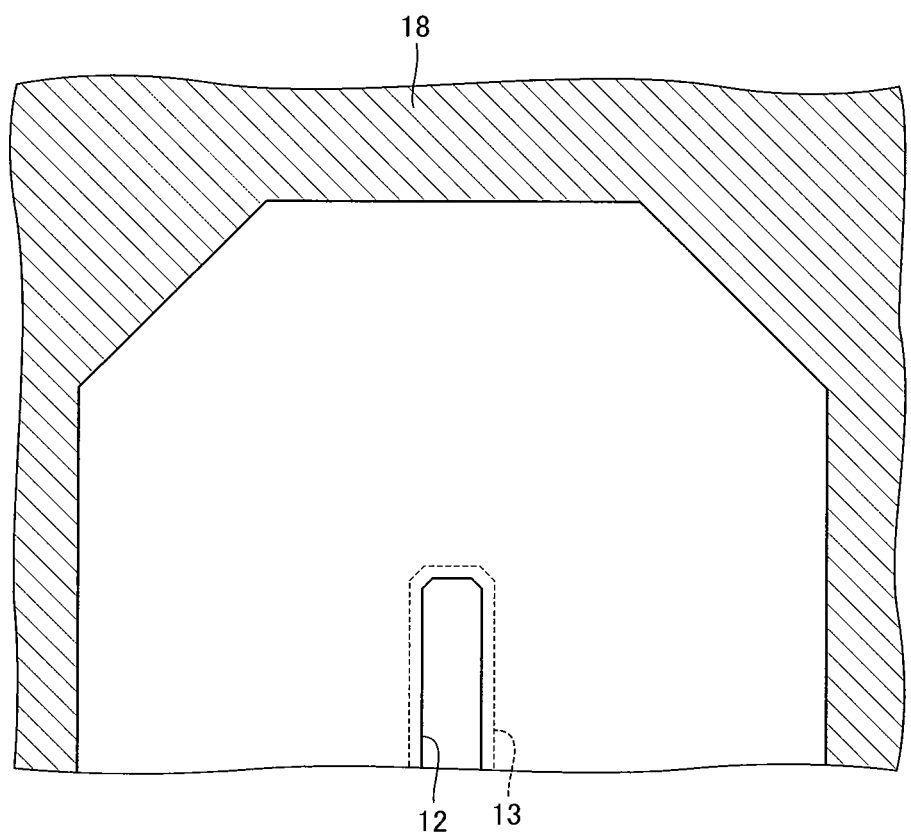
FIG. 5 is a plan view showing a structure of a comparative example.

FIG. 5 shows the planar shape of the element termination region in a comparative example of the present embodiment. In this comparative example, the width of the P type diffusion region 13 in the element region R1 is the same as that of the element termination region R2. This structure cannot prevent electric field concentration in the vicinity of the region R3 shown in FIG. 5. This causes the breakdown voltage in the element termination region to lower, thereby lowering the breakdown voltage of the semiconductor element as a whole. In this embodiment, because the width W2 of the P type diffusion region 13 in the element termination region R2 is expanded compared to the element region R1, the breakdown voltage of the semiconductor device may be raised.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

What is claimed is:
1. A semiconductor device, comprising:
a semiconductor substrate;
an element region formed on the semiconductor substrate, and including an MOS transistor formed thereon;
an element termination region formed on the semiconductor substrate and formed at an end region of the element region;
a first semiconductor layer of a first conductivity type formed to extend in a first direction as its lengthwise direction from the element region to the element termination region, the first semiconductor layer having a first impurity concentration, the first semiconductor layer functioning as a drain region of the MOS transistor in the element region;
a second semiconductor layer of the first conductivity type formed to extend in the first direction as its lengthwise direction from the element region to the element termination region, the second semiconductor layer being formed in a layer below the first semiconductor layer, the second semiconductor layer having a second impurity concentration that is smaller than the first impurity concentration;
a third semiconductor layer of the first conductivity type formed to extend in the first direction as its lengthwise direction from the element region to the element termination region, the third semiconductor layer having a third impurity concentration that is smaller than the second impurity concentration, the third semiconductor layer being arranged in contact with the second semiconductor layer to function as a drift layer of the MOS transistor;

a field oxide film formed on a surface of the third semiconductor layer and in contact with the first semicondutor layer;

a fourth semiconductor layer of a second conductivity type formed on the semiconductor layer to extend in the first direction as its lengthwise direction from the element region to the element termination region, the fourth semiconductor layer functioning as a channel region of the MOS transistor in the element region;

a fifth semiconductor layer of the first conductivity type formed on a surface of the fourth semiconductor layer and functioning as a source region of the MOS transistor; and a gate electrode formed on a surface of the semiconductor substrate between the third semiconductor layer and the fourth semiconductor layer, via a gate insulating film, a distance between a boundary between the first semiconductor layer and the field oxide film, and the end portion of the third semiconductor layer on the side of the fifth semiconductor layer in the element region is smaller than a distance between a boundary between the first semiconductor layer and the field oxide layer and an end portion of the third semiconductor layer on the side of the fifth semiconductor layer in the element termination region.

2. The semiconductor device according to claim 1, wherein
the element region and the element termination region are divided into a plurality of rectangular areas, the rectangular areas having the same width along a second direction perpendicular to the first direction,
the first semiconductor layer and the second semiconductor layer are arranged substantially at a center in the second direction of the rectangular areas, and
the fifth semiconductor layer is arranged at an end portion in the second direction of the rectangular areas.

3. The semiconductor device according to claim 2, wherein
a width of the second semiconductor layer along the second direction in the element termination region is larger than a width of the second semiconductor layer along the second direction in the element region.

4. The semiconductor device according to claim 3, wherein
a width of the fourth semiconductor layer along the second direction in the element termination region is smaller than a width of the fourth semiconductor layer along the second direction in the element region.

5. The semiconductor device according to claim 3, wherein
a planar shape of the second semiconductor layer in the vicinity of an end of the first semiconductor is a polygon.

6. The semiconductor device according to claim 1, wherein the first semiconductor layer has a rectangular shape with its lengthwise direction along the first direction.

7. The semiconductor device according to claim 6, wherein
a length of the field oxide film along a second direction perpendicular to the first direction in the element termination region is larger than a length of the field oxide film along the second direction in the element region.

8. The semiconductor device according to claim 2, wherein
a planar shape of the second semiconductor layer in the vicinity of an end of the first semiconductor is a polygon.

9. The semiconductor device according to claim 1, wherein
a width of the second semiconductor layer along a second direction perpendicular to the first direction in the element termination region is larger than a width of the second semiconductor layer along the second direction in the element region.

10. The semiconductor device according to claim 1, wherein a width of the fourth semiconductor layer along a second direction perpendicular to the first direction in the element termination region is smaller than a width of the fourth semiconductor layer along the second direction in the element region.

11. The semiconductor device according to claim 1, wherein
a planar shape of the second semiconductor layer in the vicinity of an end of the first semiconductor is a polygon.

12. A semiconductor device, comprising:
a semiconductor substrate;
an element region formed on the semiconductor substrate, and including an MOS transistor formed thereon;
an element termination region formed on the semiconductor substrate and formed at an end region of the element region;
a first semiconductor layer of a first conductivity type formed to extend in a first direction as its lengthwise direction from the element region to the element termination region, the first semiconductor layer having a first impurity concentration, the first semiconductor layer functioning as a drain region of the MOS transistor in the element region;
a second semiconductor layer of a first conductivity type formed to extend in the first direction as its lengthwise direction from the element region to the element termination region, the second semiconductor layer being formed in a layer below the first semiconductor layer, the second semiconductor layer having a second impurity concentration that is smaller than the first impurity concentration;
a third semiconductor layer of the first conductivity type formed to extend in the first direction as its lengthwise direction from the element region to the element termination region, the third semiconductor layer having a third impurity concentration that is smaller than the second impurity concentration, the third semiconductor layer being arranged in contact with the second semiconductor layer to function as a drift layer of the MOS transistor;
a fourth semiconductor layer of a second conductivity type formed on the semiconductor layer to extend in the first direction as its lengthwise direction from the element region to the element termination region, the fourth semiconductor layer functioning as a channel region of the MOS transistor in the element region;
a fifth semiconductor layer of the first conductivity type formed on a surface of the fourth semiconductor layer and functioning as a source region of the MOS transistor; and
a gate electrode formed on a surface of the semiconductor substrate between the third semiconductor layer and the fourth semiconductor layer, via a gate insulating film,
regarding a section along a second direction perpendicular to the first direction, a width of the third semiconductor layer in the element termination region is larger than a width of the third semiconductor layer in the element region.

13. The semiconductor device according to claim 12, wherein
the element region and the element termination region are divided into a plurality of rectangular areas, the rectangular areas having the same width along the second direction,
the first semiconductor layer and the second semiconductor layer are arranged substantially at a center in the second direction of the rectangular areas, and the fifth semiconductor layer is arranged at an end portion in the second direction of the rectangular areas.

14. The semiconductor device according to claim 13, wherein
a width of the second semiconductor layer along the second direction in the element termination region is larger than a width of the second semiconductor layer along the second direction in the element region.

15. The semiconductor device according to claim 14, wherein
a planar shape of the second semiconductor layer in the vicinity of an end of the first semiconductor is a polygon.

16. The semiconductor device according to claim 13, wherein
a width of the fourth semiconductor layer along the second direction in the element termination region is smaller than a width of the fourth semiconductor layer along the second direction in the element region.

17. The semiconductor device according to claim 12, further comprising a field oxide film formed on the surface of the third semiconductor layer.

18. The semiconductor device according to claim 17, wherein
a length of the field oxide film along the second direction in the element termination region is larger than a length of the field oxide film along the second direction in the element region.

19. A semiconductor device, comprising:
a semiconductor substrate;
an element region formed on the semiconductor substrate, and including an MOS transistor formed thereon;
an element termination region formed on the semiconductor substrate and formed at an end region of the element region;
a first semiconductor layer of a first conductivity type formed to extend in a first direction as its lengthwise direction from the element region to the element termination region, the first semiconductor layer having a first impurity concentration, the first semiconductor layer functioning as a drain region of the MOS transistor in the element region;
a third semiconductor layer of the first conductivity type formed to extend in the first direction as its lengthwise direction from the element region to the element termination region, the third semiconductor layer having a third impurity concentration that is smaller than the first impurity concentration, the third semiconductor layer being connected to the first semiconductor layer to function as a drift layer of the MOS transistor;
a field oxide film formed on a surface of the third semiconductor layer and in contact with the first semicondutor layer;
a fourth semiconductor layer of a second conductivity type formed on the semiconductor layer to extend in the first direction as its lengthwise direction from the element region to the element termination region, the fourth semiconductor layer functioning as a channel region of the MOS transistor in the element region;
a fifth semiconductor layer of the first conductivity type formed on a surface of the fourth semiconductor layer and functioning as a source region of the MOS transistor; and
a gate electrode formed on a surface of the semiconductor substrate between the third semiconductor layer and the fourth semiconductor layer, via a gate insulating film,
the element region and the element termination region having the same width along a second direction perpendicular to the first direction,
a distance between a boundary between the first semiconductor layer and the field oxide film, and the end portion of the third semiconductor layer on the side of the fifth semiconductor layer in the element region is smaller than a distance between a boundary between the first semiconductor layer and the field oxide layer and an end portion of the third semiconductor layer on the side of the fifth semiconductor layer in the element termination region.

20. The semiconductor device according to claim 19, wherein
a width of the fourth semiconductor layer along the second direction in the element termination region is smaller than a width of the fourth semiconductor layer along the second direction in the element region.

* * * * *